(12) United States Patent
Matsuyama et al.

(10) Patent No.: US 7,282,696 B2
(45) Date of Patent: Oct. 16, 2007

(54) PHOTOELECTRIC CONVERTER DEVICE AND MANUFACTURING METHOD THEREOF

(75) Inventors: Hisashi Matsuyama, Ogaki (JP); Isaya Kitamura, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 32 days.

(21) Appl. No.: 11/131,055

(22) Filed: May 17, 2005

(65) Prior Publication Data
US 2005/0258349 A1 Nov. 24, 2005

(30) Foreign Application Priority Data
May 19, 2004 (JP) .............................. 2004-148881

(51) Int. Cl.
*G01J 3/50* (2006.01)
(52) U.S. Cl. ...................... 250/226; 257/184; 257/294; 257/432; 348/276; 348/277
(58) Field of Classification Search ................ 250/226, 250/214.1, 216; 257/184, 258, 294, 432; 348/273, 276, 277
See application file for complete search history.

(56) References Cited

U.S. PATENT DOCUMENTS 5,889,277 A * 3/1999 Hawkins et al. ......... 250/208.1
6,342,460 B1 * 1/2002 Akimoto et al. ............... 501/55
7,037,594 B2 * 5/2006 Kojima et al. .............. 428/601
7,084,472 B2 * 8/2006 Fukuyoshi et al. ......... 257/432

FOREIGN PATENT DOCUMENTS

WO    WO 2004006336 A1 *  1/2004

OTHER PUBLICATIONS

"Shellcase Home Page" URL:http:www.shellcase.com/pages/products/products-shellOP-process.asp Wafer Level Chip Size Packaging, Oct. 2001.

* cited by examiner

*Primary Examiner*—Thanh X. Luu
*Assistant Examiner*—Stephen Yam
(74) *Attorney, Agent, or Firm*—Hogan & Hartson LLP

(57) ABSTRACT

A photoelectric converter device comprises a semiconductor substrate including a photoelectric converter element formed on its surface, a visible light filter arranged to at least partially cover the surface of the semiconductor substrate, and a support member attached to the surface of the semiconductor substrate. The photoelectric converter device further comprises, in an internal portion, a resin layer which absorbs infrared light. With this arrangement, undesirable influences of infrared light can be reduced.

8 Claims, 9 Drawing Sheets

S10

S12

S22

S24

SCRIBE LINE

PHOTOELECTRIC CONVERTER DEVICE AND MANUFACTURING METHOD THEREOF

CROSS-REFERENCE TO RELATED APPLICATIONS

The entire disclosure of Japanese Patent Application No. 2004-148881 including the specification, claims, drawings, and abstract is incorporated herein by reference.

BACKGROUND OF THE INVENTION

1. Field of the Invention

The present invention relates to a photoelectric converter device in which the wavelength characteristic is adjusted by means of a wavelength filter, and to a method for manufacturing the photoelectric converter device.

2. Description of the Related Art

In recent years, a chip size package (CSP) comprising wiring lines drawn out from a side surface of an element is widely used to miniaturize devices such as photoelectric converter devices which include photoelectric converter elements.

FIGS. 12A and 12B illustrate top and bottom external views, respectively, of a semiconductor integrated device configured as a CSP. The CSP is constituted by adhering an upper support member 14 and a lower support member 16 on upper and lower surfaces, respectively, of a semiconductor chip 10 by means of resin layers 12 composed of epoxy or the like. External wiring lines 18 are drawn out from side surfaces of the semiconductor chip 10 sealed between the upper support member 14 and the lower support member 16. The external wiring lines 18 are connected to ball-shaped terminals 20 provided on the bottom side of the CSP.

FIG. 13 shows a cross-sectional view of a conventional photoelectric converter device including photoelectric converter elements configured as a CSP. The semiconductor chip 10 is formed as a lamination of a semiconductor substrate 10a having photoelectric converter elements formed on its upper surface, color filters 10b and 10c disposed to at least partially cover the photoelectric converter elements for absorbing or reflecting light in predetermined wavelength regions, and a planarization film 10d for planarizing surface unevenness. The upper support member 14 is adhered to the upper side of the semiconductor chip 10 via a resin layer 12, while the lower support member 16 is adhered to the lower side of the semiconductor chip 10 via another resin layer 12. With this arrangement, by employing a light-transmitting substrate made of glass or the like as the upper support member 14, external light can be introduced into the photoelectric converter elements formed on the upper side of the semiconductor chip 10.

In the above-described arrangement, each of the color filters, which is a visible light filter for permitting transmission of visible light, is composed of a filter material which mainly permits transmission of red (R), green (G), or blue (B) wavelength region. FIG. 14 illustrates sensitivity characteristics of a photoelectric converter element obtained when using red (R), green (G), and blue (B) color filters that are typically employed. A typical color filter exhibits a relatively high transmittance in the infrared region exceeding 700 nm in addition to in a wavelength region of the corresponding color. Further, a silicon photoelectric converter element shows responses in the infrared region exceeding 700 nm. In FIG. 14, wavelengths of incident light into the filters are given on the horizontal axis, while sensitivity levels obtained at various wavelengths are given on the vertical axis. In FIG. 14, line A denotes a characteristic obtained when using a color filter corresponding to the red (R) wavelength region, line B denotes a characteristic obtained when using a color filter corresponding to the green (G) wavelength region, and line C denotes a characteristic obtained when using a color filter corresponding to the blue (B) wavelength region. Furthermore, line D denotes a typical example sensitivity characteristic, with respect to various wavelengths, of a photoelectric converter element (without color filters) formed on a silicon substrate.

As can be seen, when a color image is captured using these color filters, the obtained output signals for the respective colors are influenced by noise generated due to infrared components included in the incident light. Consequently, when those output signals are combined to produce an image, correct white balance of the image cannot be achieved.

In order to avoid the above-described problem, a structure as shown in FIG. 15 is conventionally used. In FIG. 15, an infrared cut-off filter 102 is arranged so as to cover the incident surface of a photoelectric converter device 100 configured as a CSP, while a lens 104 is provided to direct incident light into the photoelectric converter elements.

As can be seen in FIG. 15, the structure including the infrared cut-off filter 102 provided over the photoelectric converter device 100 is disadvantageous in that the overall device size becomes very large.

Another disadvantage is that the cost of the infrared cut-off filter 102 is very high because the filter 102 is fabricated by laminating many layers of infrared-absorbing materials having different characteristics on a glass substrate. Use of the infrared cut-off filter 102 is one significant factor which increases the fabrication costs of the photoelectric converter device 100. Furthermore, when employing a configuration in which the infrared-absorbing films are formed on the surface of the glass substrate, the infrared cut-off filter 102 often becomes damaged due to handling during the fabrication process. Moreover, the difference in contraction ratio between the glass substrate and the infrared-absorbing films may result in curving and partial peeling of the infrared cut-off filter 102.

SUMMARY OF THE INVENTION

The present invention provides a photoelectric converter device comprising a semiconductor substrate including a photoelectric converter element formed on its surface, a visible light filter arranged to at least partially cover the surface of the semiconductor substrate, and a support member attached to the surface of the semiconductor substrate. The photoelectric converter device further comprises, in an internal portion, a resin layer which absorbs infrared light.

The photoelectric converter device according to the present invention can be fabricated by a photoelectric converter device manufacturing method comprising a first step of forming a photoelectric converter element on a surface of a semiconductor substrate, a second step of arranging a visible light filter to at least partially cover the photoelectric converter element, and a third step of attaching, to the surface of the semiconductor substrate, a support member configured by adhering a plurality of supports having a light-transmitting property by means of a resin which absorbs infrared light.

BRIEF DESCRIPTION OF THE DRAWINGS

Preferred embodiments of the present invention will be described in detail based on the following drawings, wherein.

DESCRIPTION OF THE PREFERRED EMBODIMENTS

Figure 1:
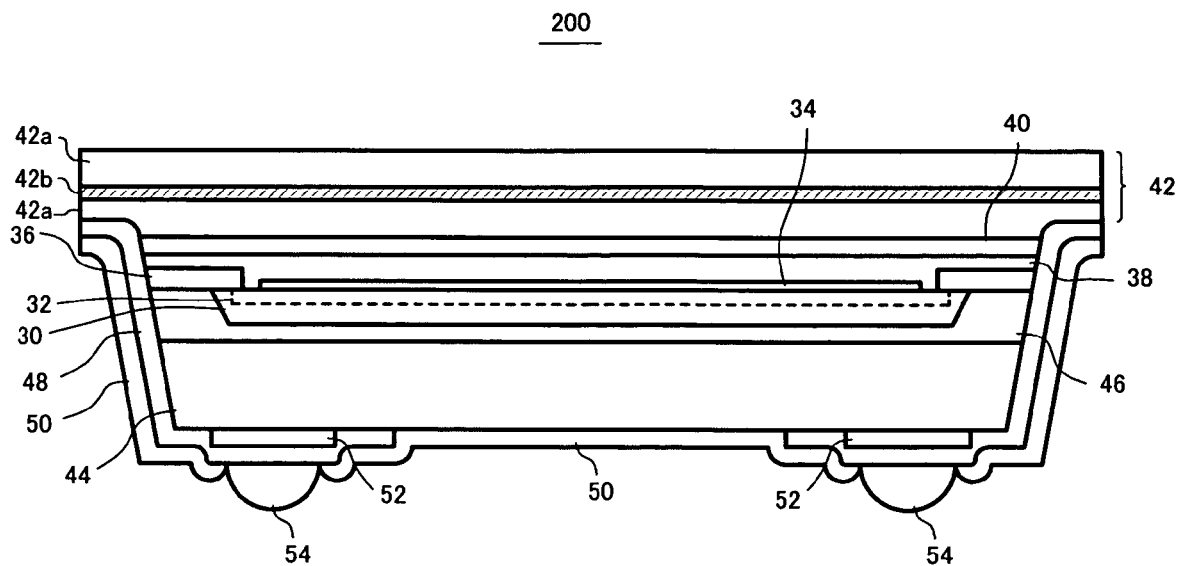
FIG. 1 is a cross-sectional view showing a configuration of a photoelectric converter device according to a preferred embodiment of the present invention.
Figure 2:
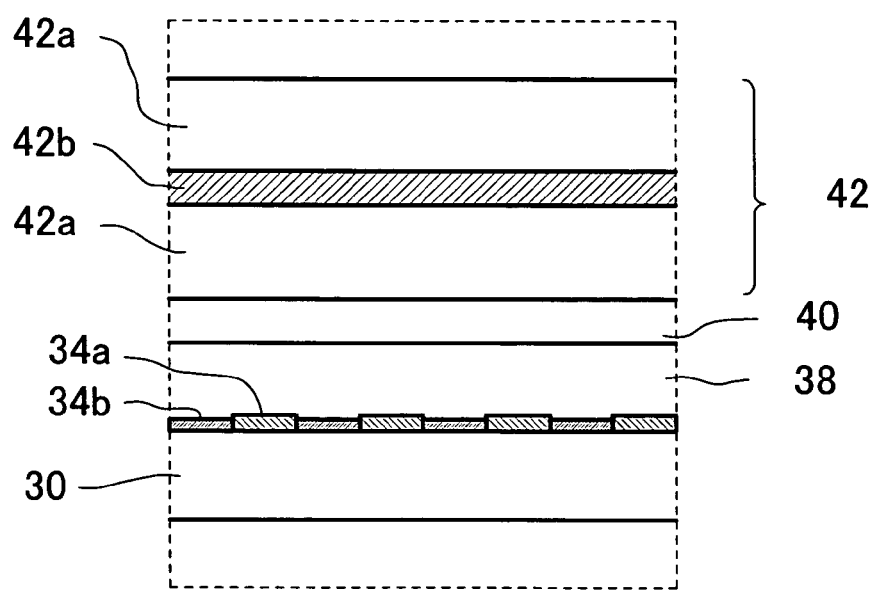
FIG. 2 is a cross-sectional view showing a main portion of the photoelectric converter device according to the preferred embodiment.

A photoelectric converter device according to a preferred embodiment of the present invention is described below in detail referring to the drawings. FIG. 1 is a cross-sectional view of a photoelectric converter device 200 according to a preferred embodiment of the present invention in which the chip size package (CSP) structure is employed. FIG. 2 is an enlarged cross-sectional view showing the main portion of the photoelectric converter device 200. In FIG. 2, the components are illustrated while appropriately changing the thicknesses for the clarity of description.

A semiconductor integrated circuit 32 including a photoelectric converter element is formed on a surface of a semiconductor substrate 30. Two types of color filters 34a, 34b, which are visible light filters, are provided, each partially covering the photoelectric converter element formed on the surface of the semiconductor substrate 30.

Figure 14:
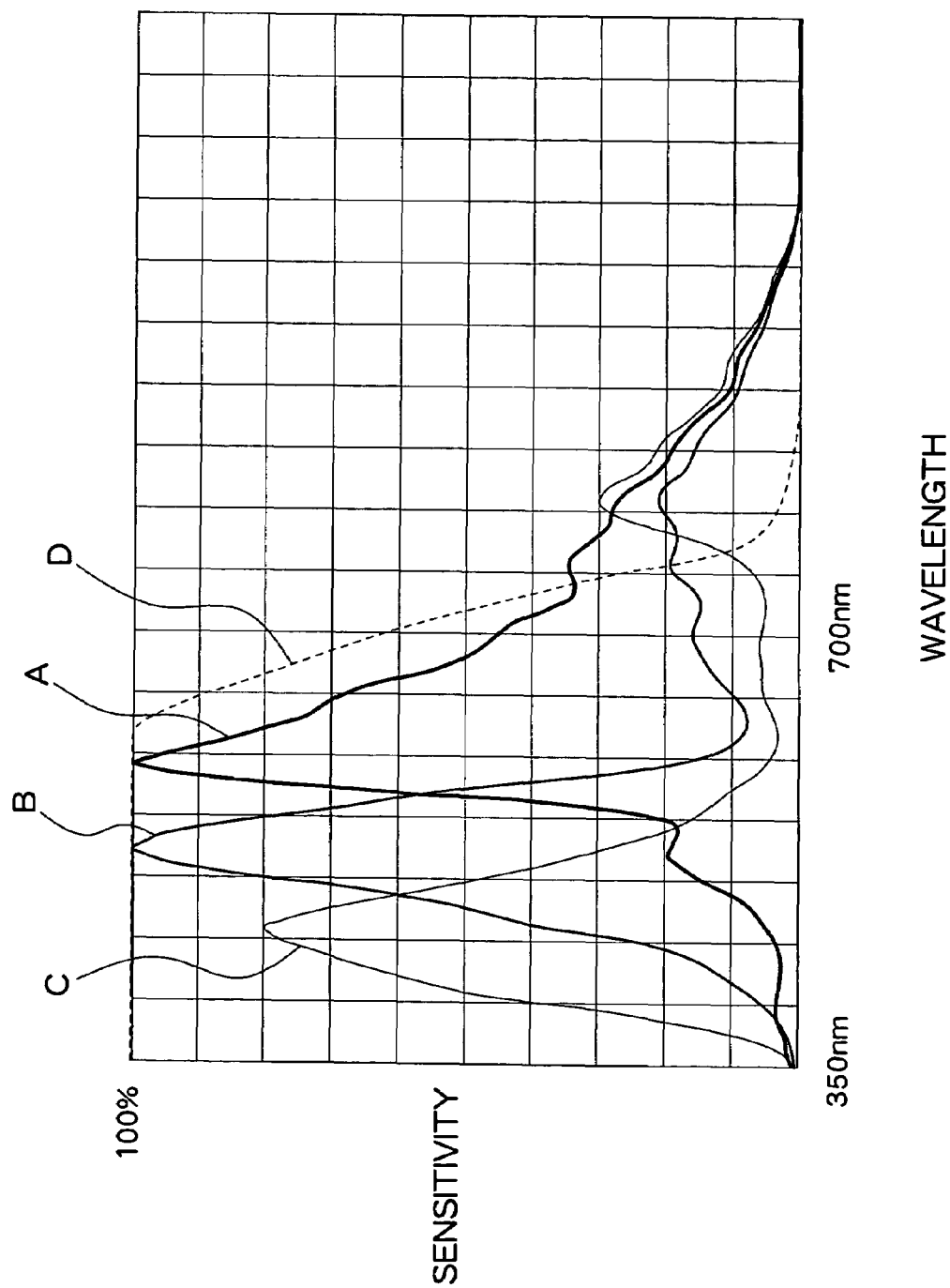
FIG. 14 is a graph showing transmittance characteristics of typical color filters.
Figure 15:
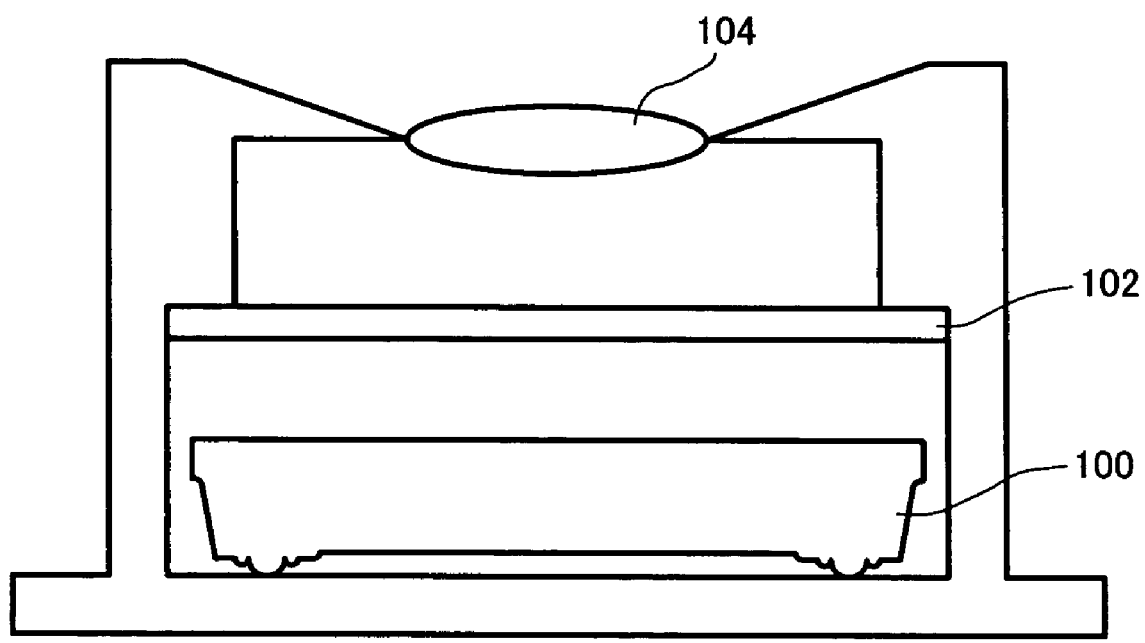
FIG. 15 is a cross-sectional view showing a configuration of the background art photoelectric converter device.

Each of the color filters 34a, 34b may be composed of a typical color filter having a red (R), or green (G), or blue (B) wavelength region as the transmittance band region as shown in FIG. 14. Further formed on the surface of the semiconductor substrate 30 is an internal wiring line 36 which is connected to the semiconductor integrated circuit 32. The internal wiring line 36 is connected to a wiring in the semiconductor integrated circuit 32 via, for example, a contact hole created in an insulation film (such as an oxide film) formed over the semiconductor integrated circuit 32. The internal wiring line 36 serves to provide electrical connection between the semiconductor integrated circuit 32 and outside.

A planarization film 38 for planarizing surface unevenness is formed over the surface of the semiconductor substrate 30 on which the color filters 34a, 34b and the internal wiring line 36 are provided. The planarization film 38 may be formed using a resin such as epoxy as the main material.

An upper support member 42 is adhered, by means of a resin layer 40, to the surface of the semiconductor substrate 30 planarized by the planarization film 38. Further, a lower support member 44 is attached to the rear side of the semiconductor substrate 30 by means of a resin layer 46. The upper 42 and lower 44 support members serve to increase structural strength of the photoelectric converter device.

A conductive external wiring line 48 is arranged extending from a side surface of the semiconductor substrate 30 to the lower support member 44 while being placed in contact with a terminal of the internal wiring line 36. This external wiring line 48 connects the internal wiring line 36 to a ball-shaped terminal 54 provided on the underside of the lower support member 44. The ball-shaped terminal 54 is arranged on a buffer member 52 which is provided for reducing stress generated with respect to the lower support member 44. The surface of the lower support member 44 on which the external wiring line 48 is provided is covered with a protection film 50 to protect against corrosion.

As shown in FIGS. 1 and 2, the upper support member 42 is configured by adhering a plurality of supports 42a by means of a resin layer 42b. While two layers of supports 42a are shown in FIGS. 1 and 2, the upper support member 42 may alternatively be configured by adhering three or more supports 42a using resin layers 42b. When the semiconductor integrated circuit 32 includes a photoelectric converter element, the supports 42a are composed using a material having high optical transmittance, such as glass. In this arrangement, the thickness of the supports 42a preferably falls within the range from 100 µm to 1 mm. A thickness within this range ensures both sufficient mechanical strength and transmittance in the upper support member 42. The resin layer 42b is composed of a material containing an infrared absorbent. For example, the resin layer 42b can favorably be composed of a material obtained by mixing, into epoxy, divalent copper ion metal complex which is an infrared absorbent.

By employing the upper support member 42 configured by adhering the supports 42a using the resin layer 42b containing an infrared absorbent, the need to provide a separate infrared cut-off filter on the outside of the photoelectric converter device 200 can be eliminated. In this manner, the overall device size can be reduced, and the fabrication costs can be minimized.

Further, because the resin layer 42b is interposed between the rigid supports 42a made of glass or the like, it is possible to prevent generation of damages on the resin layer 42b when handling the upper support member 42 during the manufacturing process of the photoelectric converter device 200. Moreover, in the present embodiment, the amount of stress applied to the upper and lower sides of the resin layers 42b become balanced. Accordingly, it is possible to avoid problems such as curving of the upper support member 42 and peeling of the resin layer 42b which may be caused by a difference in contraction ratio between the supports 42a and the resin layer 42b. As a result, device handling during the manufacturing process is facilitated, enabling reduction in fabrication costs. In addition, reliability and durability of the photoelectric converter device 200 during use over a long period of time can be enhanced.

While the upper support member 42 is configured by adhering two supports 42a by means of a single resin layer 42b in the above embodiment, the present invention is not limited by this feature. The upper support member 42 may alternatively be configured by laminating more number of supports 42a. When the upper support member 42 includes two or more resin layers 42b, it may be preferable to adjust factors such as the type of infrared absorbent and its content within the respective resin layers 42b so as to obtain resin layers having different infrared-absorbing characteristics.

It may also be favorable to use a material containing an infrared absorbent to form the planarization film 38 and the resin layer 40. The infrared absorbent is preferably a material obtained by mixing divalent copper ion metal complex into epoxy. By including the infrared absorbent in the planarization film 38 and the resin layer 40, a multilayer infrared-absorbing filter can be formed using these layers 38, 40 in combination with the resin layer 42b. In this arrangement, it may be preferable to change the types or added amounts of the infrared absorbent among the resin layer 40 for adhering the upper support member 42 to the semiconductor substrate 30, the resin layer 42b for adhering the supports 42a of the upper support member 42 to one another, and the planarization film 38, to thereby obtain at least two layers having different infrared-absorbing characteristics. By changing the infrared-absorbing characteristics between the respective layers as described above, an infrared-absorbing filter having a wide absorption bandwidth and a high absorption ratio can be realized.

Figure 3:
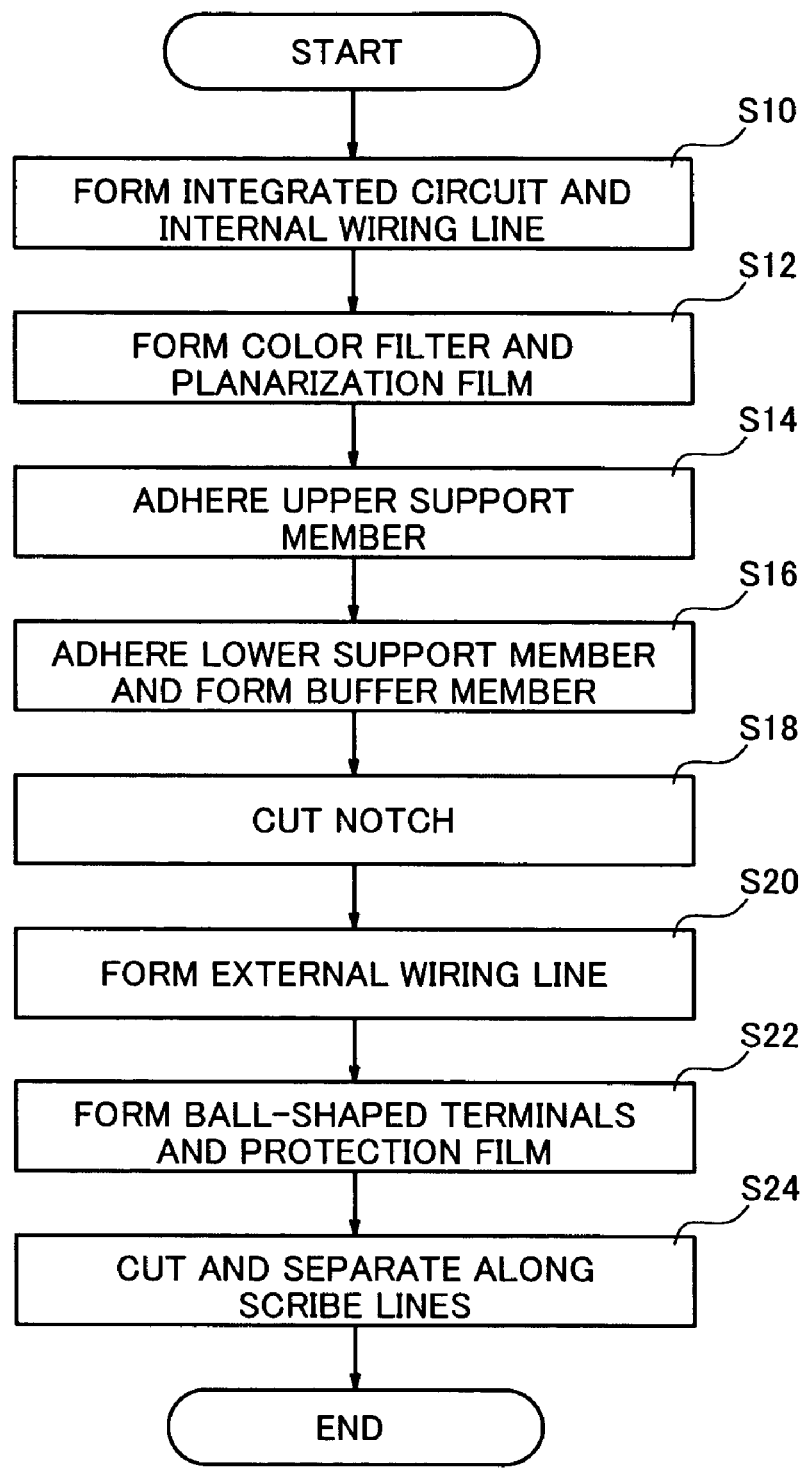
FIG. 3 is a flowchart illustrating a method of manufacturing a photoelectric converter device according to the preferred embodiment.

A method for manufacturing a photoelectric converter device 200 according to an embodiment of the present invention is next described. FIG. 3 is a flowchart showing steps for manufacturing the photoelectric converter device 200. FIGS. 4-11 show cross-sectional structures of the photoelectric converter device 200 obtained in the respective steps. Photoelectric converter devices 200 are fabricated by first forming semiconductor integrated circuits in corresponding segments of a semiconductor substrate defined by scribe lines, and, after laminating other components, separating the devices along the scribe lines for sealing the devices into chip size packages. For the clarity of description, the cross-sectional structure around the scribe line is schematically depicted in the drawings.

Figure 4:
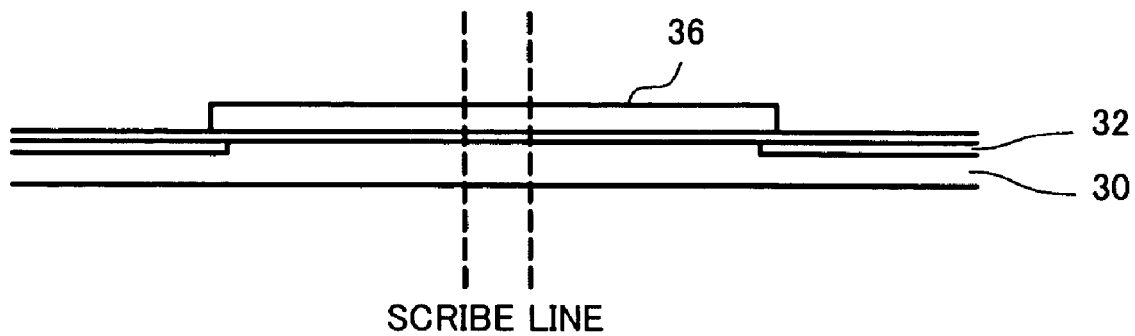
FIG. 4 is a cross-sectional view showing an internal structure obtained in step S10 according to the preferred embodiment.

In step S10, semiconductor integrated circuits 32 are formed in surface areas of a semiconductor substrate 30, as shown in FIG. 4. When the semiconductor integrated circuits 32 are photoelectric converter elements, the semiconductor integrated circuits 32 may include an image capturing portion, accumulating portion, horizontal transfer portion, output portion, and the like. Subsequently, an insulation film is formed on the surface of the semiconductor substrate 30. The insulation film may be a silicon oxide film, for example. Further, contact holes are created through the insulation film at predetermined locations using photolithographic or other techniques. An internal wiring line 36 is formed through the contact holes so as to connect to internal wiring of the semiconductor integrated circuits 32. The internal wiring line 36 is formed spanning over a scribe line which defines a border between two adjacent semiconductor integrated circuits 32.

Figure 5:
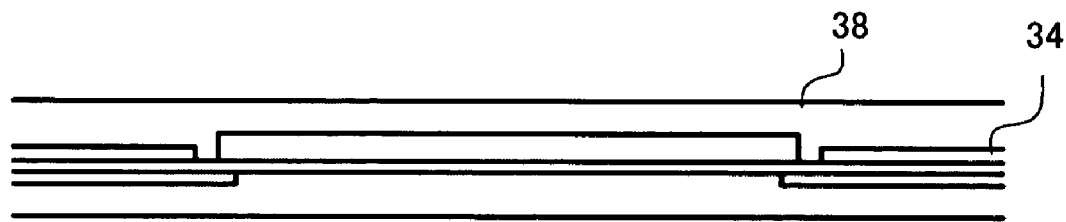
FIG. 5 is a cross-sectional view showing an internal structure obtained in step S12 according to the preferred embodiment.

In step S12, as shown in FIG. 5, color filters 34 having a transmittance band in the visible light region are formed covering at least a portion of the surface region of the semiconductor integrated circuits 32 in which the photoelectric converter elements are disposed. When performing this step, a known masking technique such as photolithography may be used to laminate the color filters 34 in the required areas. When a semiconductor integrated circuit 32 includes light-receiving pixels composed of photoelectric converter elements arranged in a matrix, filters each permitting transmission of light having one of the three primary colors of red (R), green (G), or blue (B) may be laminated in a predetermined arrangement for the respective pixels, so as to achieve capturing of a color image. Further, it is preferable to subsequently deposit a planarization film 38 in order to planarize surface unevenness created by the color filters 34 and the internal wiring line 36. The planarization film 38 can be composed of a resin material such as acrylic resin and epoxy resin.

The planarization film 38 may preferably be formed using a material having an infrared absorbent such as divalent copper ion metal complex mixed therein. By designing the planarization film 38 to include an infrared absorbent in a manner such that the infrared-absorbing characteristic of the planarization film 38 differs from that of the resin layer 40 or the resin layer 42b in the upper support member 42 (which are formed in the following step), a multilayer infrared-absorbing filter can be configured using the planarization film 38 in combination with the resin layer 40 or the resin layer 42b, making it possible to create an infrared-absorbing filter having a wide absorption bandwidth and a high absorption ratio.

Figure 6:
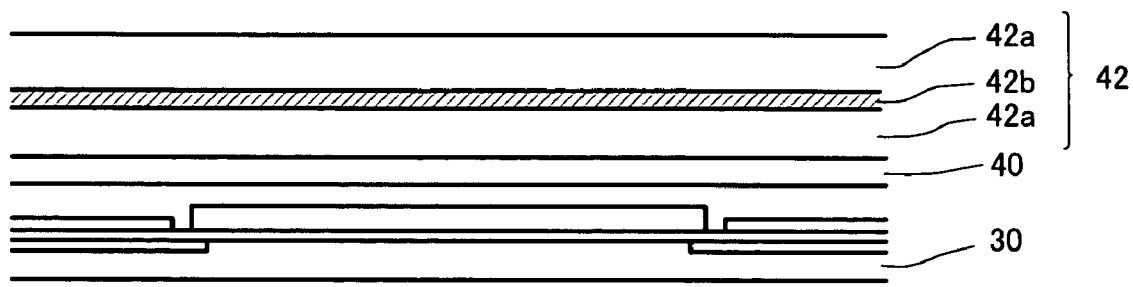
FIG. 6 is a cross-sectional view showing an internal structure obtained in step S14 according to the preferred embodiment.

In step S14, as shown in FIG. 6, the resin layer 40 is applied to the planarized surface of the semiconductor substrate 30, and the upper support member 42 is attached using the resin layer 40 as the adhesive. The resin layer 40 may be composed of a material such as acrylic resin and epoxy resin. As also shown in FIGS. 1 and 2, the upper support member 42 is configured by adhering supports 42a made of a material having high optical transmittance by means of the resin layer 42b. The resin layer 42b is preferably composed of a material obtained by mixing, into epoxy or the like, an infrared absorbent such as divalent copper ion metal complex. The upper support member 42 may be assembled into a laminated structure in advance.

The resin layer 40 may preferably be formed using a material having an infrared absorbent such as divalent copper ion metal complex mixed therein. By designing the resin layer 40 to include an infrared absorbent in a manner such that the infrared-absorbing characteristic of the resin layer 40 differs from that of the planarization film 38 or the resin layer 42b in the upper support member 42, a multilayer infrared-absorbing filter can be configured using the resin layer 40 in combination with the planarization film 38 or the resin layer 42b, making it possible to create an infrared-absorbing filter having a wide absorption bandwidth and a high absorption ratio.

Figure 7:
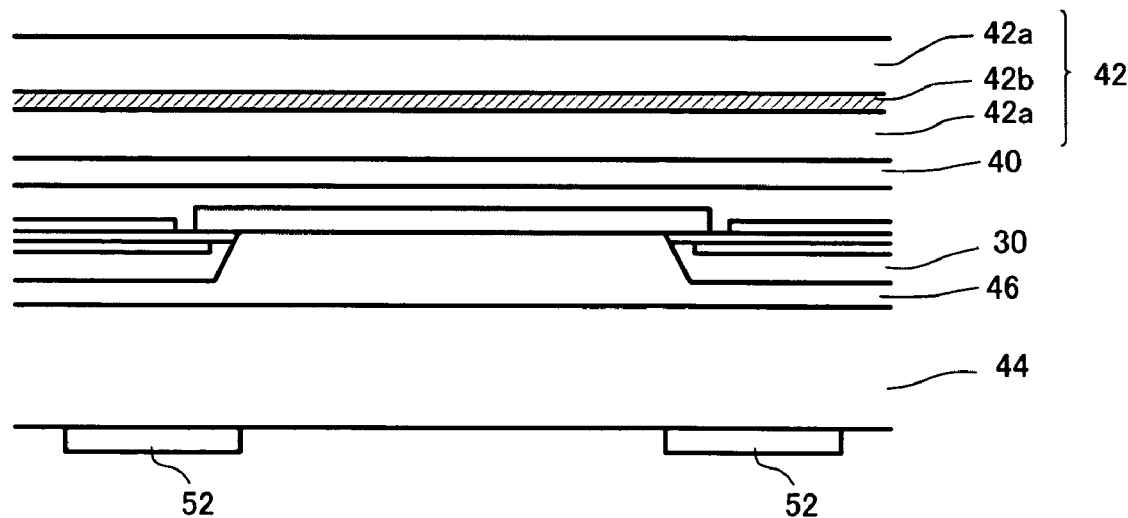
FIG. 7 is a cross-sectional view showing an internal structure obtained in step S16 according to the preferred embodiment.

In step S16, as shown in FIG. 7, the semiconductor substrate 30 is first etched along the scribe line from the underside so as to expose the internal wiring line 36 to the rear side of the semiconductor substrate 30. When the semiconductor substrate 30 is a silicon substrate, this etching step can be performed by chemical etching using a mixture liquid containing hydrofluoric acid, acetic acid, or the like. Before performing the chemical etching, it may be preferable to mechanically reduce the thickness of the semiconductor substrate 30 by grinding.

Further, as shown in FIG. 7, a resin layer 46 is applied to the rear side of the semiconductor substrate 30, and a lower support member 44 is attached thereto. Buffer members 52 are formed on the main surface of the lower support member 44, namely, on the rear side of the photoelectric converter device. The buffer members 52 serve as cushions which alleviate stress applied to the ball-shaped terminals 54 provided over the buffer members 52 in a subsequent step.

Figure 8:
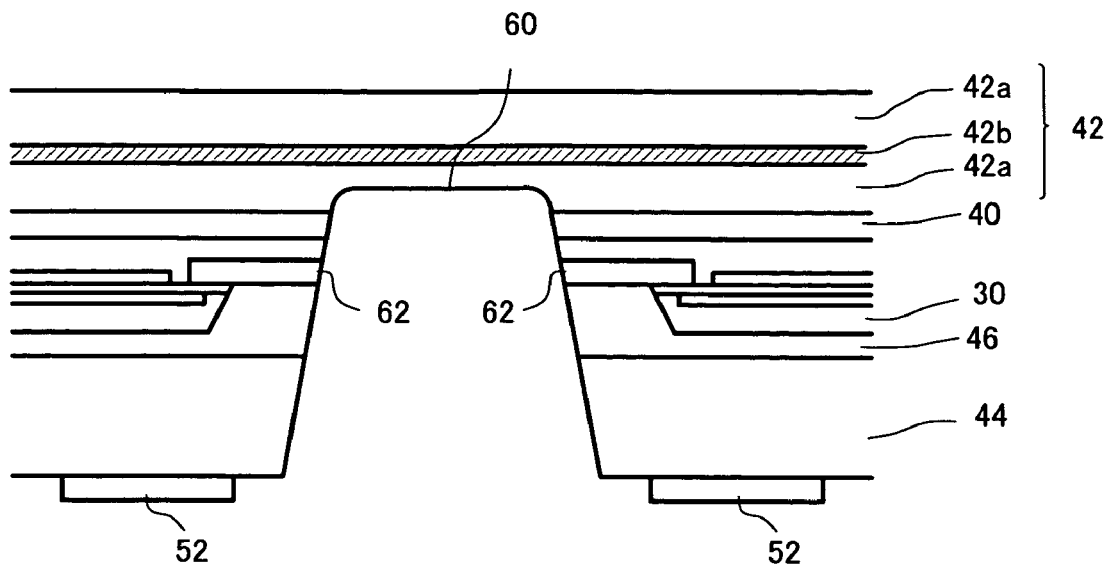
FIG. 8 is a cross-sectional view showing an internal structure obtained in step S18 according to the preferred embodiment.

In step S18, as shown in FIG. 8, a cutting device such as a dicing saw is employed to cut on the side of the lower support member 44 along the scribe line. A notch 60 having an inverted V shape is thereby created in the lower support member 44, resin layer 46, internal wiring line 36, resin layer 40, and upper support member 42. Ends 62 of the internal wiring lines 36 are exposed to an inner side surface of the notch 60.

Figure 9:
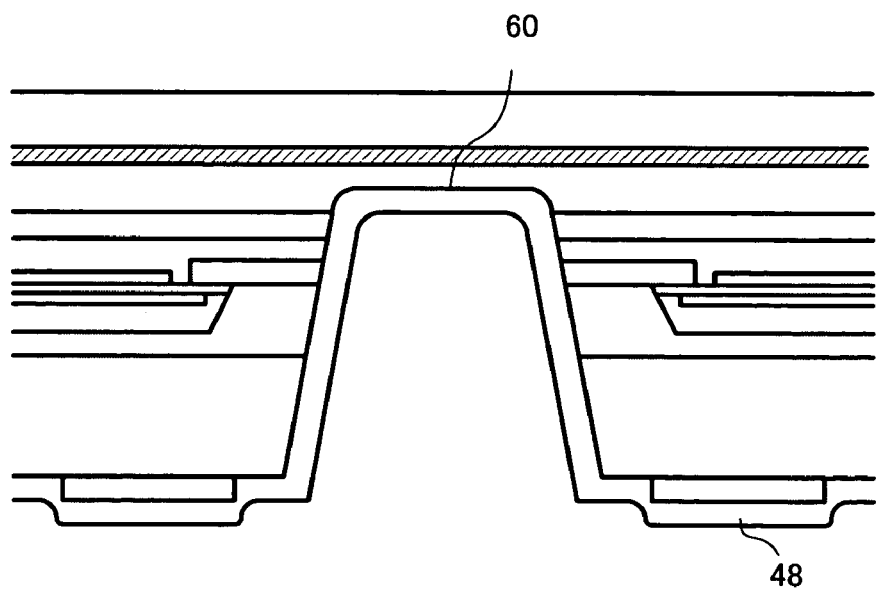
FIG. 9 is a cross-sectional view showing an internal structure obtained in step S20 according to the preferred embodiment.

In step S20, as shown in FIG. 9, a metal film is deposited on the external surface of the lower support member 44 and the inner surface of the notch 60. This metal film is patterned into external wiring lines 48 for attaining contact between the internal wiring lines 36 and the buffer members 52. The patterning may be performed using a known photolithographic technique or etching technique.

Figure 10:
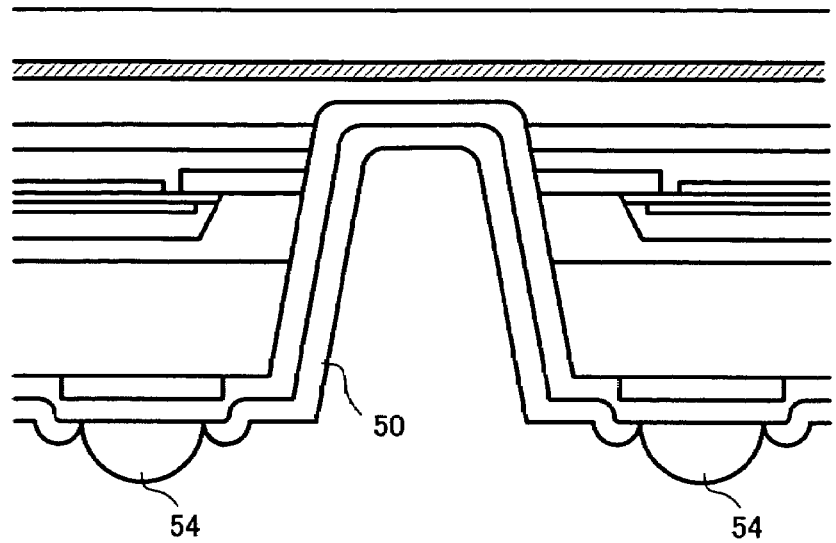
FIG. 10 is a cross-sectional view showing an internal structure obtained in step S22 according to the preferred embodiment.
Figure 11:
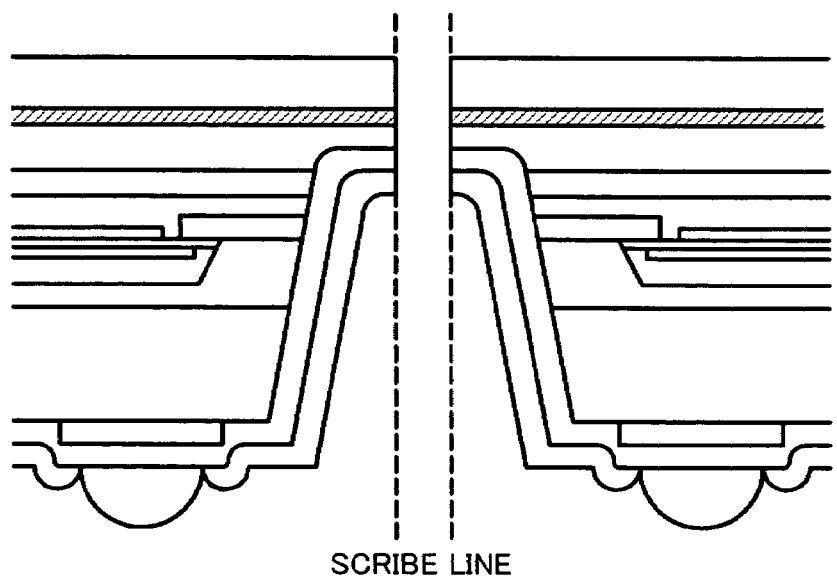
FIG. 11 is a cross-sectional view showing an internal structure obtained in step S24 according to the preferred embodiment.
Figure 12A:
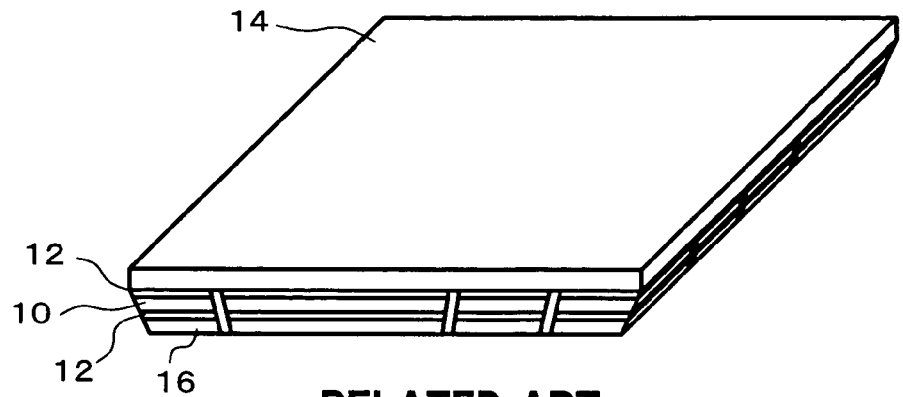
FIGS. 12A and 12B are external perspective views of a background art photoelectric converter device.
Figure 12B:
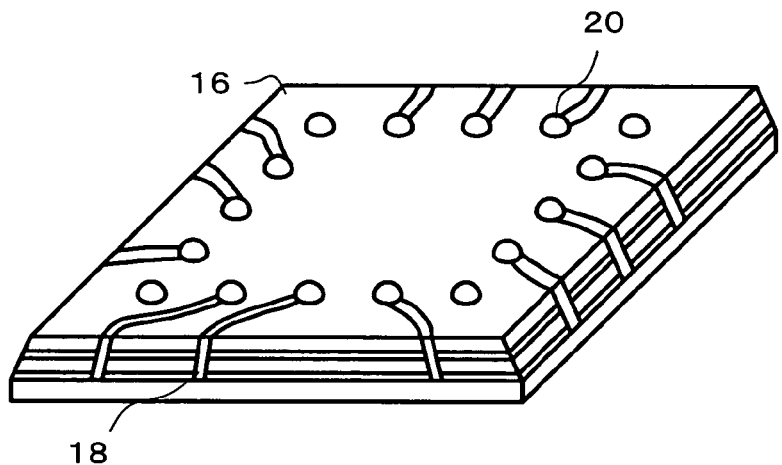
Figure 13:
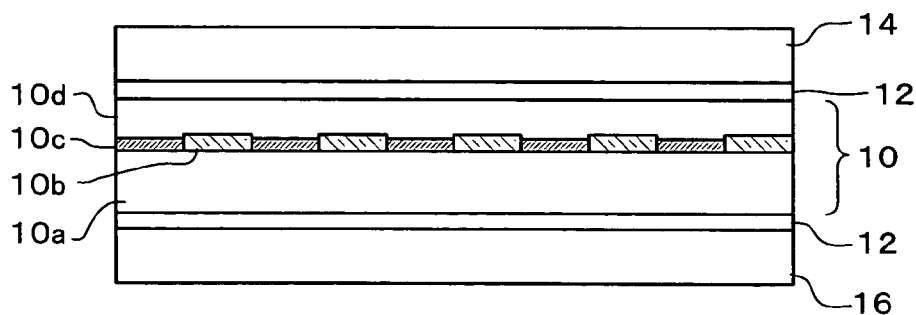
FIG. 13 is a cross-sectional view showing an internal structure of the background art photoelectric converter device.

In step S22, a protection film 50 and ball-shaped terminals 54 are formed as shown in FIG. 10. The protection film 50 may be formed using an organic material such as EVA material. A ball-shaped terminal 54 can be formed by heating and reflowing a ball-shaped solder material on the surface of a buffer member 52.

In step S24, the product obtained as a result of the above steps is separated along the scribe line. By using a dicing saw or the like to cut and separate along the scribe line, individual photoelectric converter devices configured as chip size packages can be obtained.

Because the upper support member 42 has a laminated structure configured by adhering the supports 42a by means of the resin layer 42b, generation of defects such as cracking of the supports 42a of the upper support member 42 during the above-described cutting steps can be minimized. The effectiveness of the defect minimization is particularly evident when a support 42a has a thickness within the range from 100 μm to 1 mm. Accordingly, a higher yield in the manufacture of the photoelectric converter devices 200 can be attained. Furthermore, reliability and durability of the photoelectric converter devices 200 can be enhanced.

According to the above-described embodiments, undesirable influences of infrared light which impair the white balance when a color image is captured can be reduced. Further, while achieving a reduction in size of the photoelectric converter device configured as a chip size package, generation of defects such as cracking during manufacture can be minimized to attain a higher production yield.

What is claimed is:

1. A photoelectric converter device, comprising:
   a semiconductor substrate including a photoelectric converter element formed on its surface;
   a visible light filter arranged to at least partially cover the surface of the semiconductor substrate; and
   a support member attached, by means of a resin, to the surface of and mechanically supporting the semiconductor substrate; wherein
   the support member is configured by adhering a plurality of light-transmitting supports by means of a resin which absorbs infrared light.

2. The photoelectric converter device as defined in claim 1, wherein
   the support member is attached to the surface of the semiconductor substrate by means of the resin which absorbs infrared light.

3. The photoelectric converter device as defined in claim 1, further comprising:
   a planarization film for planarizing surface unevenness of the semiconductor substrate; wherein
   the planarization film is composed of a resin which absorbs infrared light.

4. The photoelectric converter device as defined in claim 1, wherein
   the resin which absorbs an infrared light is a resin material having divalent copper ion metal complex mixed therein.

5. The photoelectric converter device as defined in claim 2, further comprising:
   a planarization film for planarizing surface unevenness of the semiconductor substrate; wherein
   the planarization film is composed of a resin which absorbs an infrared light; and
   at least two of the resin which attaches the supports within the support member, the resin which attaches the support member to the semiconductor substrate, and the resin which constitutes the planarization film have infrared-absorbing characteristics that differ from one another.

6. The photoelectric converter device as defined in claim 1, wherein
   the support member is configured using a glass plate having a thickness within a range from 100 μm to 1 mm.

7. A method for manufacturing a photoelectric converter device, comprising:
   a first step of forming a photoelectric converter element on a surface of a semiconductor substrate;
   a second step of arranging a visible light filter to at least partially cover the photoelectric converter element; and
   a third step of attaching, to the surface of the semiconductor substrate, a support member configured by adhering a plurality of supports having a light-transmitting property by means of a resin which absorbs infrared light, the support member mechanically supporting the semiconductor substrate.

8. The photoelectric converter device manufacturing method as defined in claim 7, wherein
   in the first step, a photoelectric converter element is formed in each segment of the surface of the semiconductor substrate defined by a scribe line; and
   after the third step, a fourth step of cutting the semiconductor substrate and at least a portion of the support member along the scribe line is performed.

* * * * *